United States Patent [19]
Aponte et al.

[11] Patent Number: 6,137,061
[45] Date of Patent: *Oct. 24, 2000

[54] REDUCTION OF PARASITIC THROUGH HOLE VIA CAPACITANCE IN MULTILAYER PRINTED CIRCUIT BOARDS

[75] Inventors: Luis A. Aponte, Andover; Mark Benda, Highland Lakes; Joseph Peter Savicki, Clinton, all of N.J.

[73] Assignee: Lucent Technologies Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/904,526

[22] Filed: Aug. 1, 1997

[51] Int. Cl.[7] ...................................................... H05K 1/16
[52] U.S. Cl. .......................... 174/260; 174/266; 361/795
[58] Field of Search .................................. 174/266, 267, 174/52.4, 761, 260; 361/750, 760, 762, 791, 784, 772, 792, 795; 257/777

[56] References Cited

U.S. PATENT DOCUMENTS 3,792,383  2/1974  Knappenberger .................... 333/84 M
4,641,426  2/1987  Hartman et al. .......................... 29/839
5,065,284  11/1991  Hernandez .............................. 361/414

Primary Examiner—Jeffrey Gaffin
Assistant Examiner—Jeremy Norris
Attorney, Agent, or Firm—Claude R. Narcisse

[57] ABSTRACT

A printed circuit board that reduces parasitic effects on devices mounted thereon. The printed circuit board comprises a top layer and a bottom layer of a first insulating material having a first dielectric constant. The layers are configured to form holes whereby each of the holes has a first part extending through the top layer and a second part extending through the bottom layer. The bottom layer is further configured to comprise a second insulating material having a second dielectric constant, which second insulating material surrounds the second part of the hole. The devices mounted onto the printed circuit board have pins that extend through the holes. When the second dielectric constant is less than the first dielectric constant, the parasitic effects on the pins of the mounted devices are reduced.

5 Claims, 2 Drawing Sheets

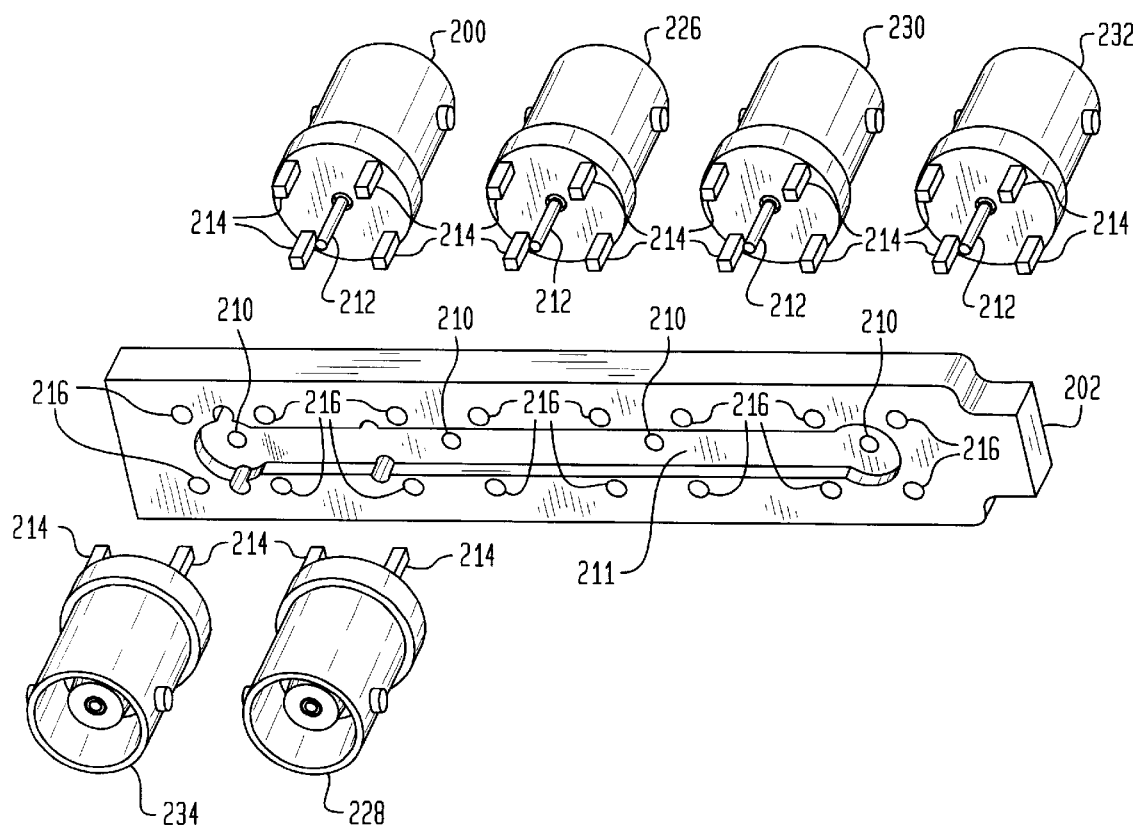

6,137,061

REDUCTION OF PARASITIC THROUGH HOLE VIA CAPACITANCE IN MULTILAYER PRINTED CIRCUIT BOARDS

BACKGROUND OF THE INVENTION

1. Field of the Invention

This invention relates to parasitic capacitance in multilayer printed circuit boards and in particular to the reduction of parasitic capacitance in interconnection modules.

2. Description of the Related Art

In many communication systems electrical communication signals are conveyed between various equipment used in such systems. Typically, the electrical signals can be interconnected and routed to various equipment located at a central office. The interconnection and routing of the electrical signals are implemented with interconnection modules, some of which are called Digital Distributing Frames (DDF).

In a central office which may contain various communication equipment, a plurality of DDF modules are typically disposed in a housing. Typically, a DDF module comprises several connectors (e.g., BNC connectors) with electrical connections substantially perpendicular to a printed circuit board of a certain thickness which contains electrical ground planes and circuit traces (i.e., etched conductors) that connect the appropriate sets of the mounted connectors.

Referring to FIG. 1, there is shown a side view of a portion of a DDF module. Connector 100 is mounted to a printed circuit board having three layers 102, 104 and 106. The layers are typically made from insulating material having a certain dielectric constant. A conductor 108 is etched or plated onto layer 104 and connected to plated through hole 110. Connector 100 has mounting pins 114 that are inserted into mounting holes 116. Connector 100 has center conductor 112 which is electrically connected to conductor 108 via plated through hole 110. Center conductor 112 extends through plated through hole (or via) 110 past conductor 108 and extends through the remaining depth of the printed circuit board. The portion of center conductor 112 that extends past conductor 108 creates a parasitic effect on conductor 108 and on circuits connected to conductor 108.

A parasitic effect is the creation of extraneous circuit elements (e.g., capacitance, inductance) resulting from the particular geometry of conductors and insulating material associated with a circuit. The parasitic effect associated with center conductor 112 tends to be a parasitic capacitance. Such a parasitic capacitance can distort electrical signals carried by center conductor 112 and effect adversely the performance of circuits connected to central conductor 112. The extent of the effect on circuit performance and signals depends on the value of the parasitic capacitance. The value of the parasitic capacitance is determined in part by the length of center conductor 112, the diameter of center conductor 1 12 and the dielectric constant of the material surrounding the part of center conductor 112 extending past conductor 108.

Therefore, there is a need to reduce the parasitic effects resulting from the geometry of a printed circuit board and the conductors inserted therein.

SUMMARY OF THE INVENTION

The present invention provides for a printed circuit board that is configured to reduce parasitic effects on devices mounted thereon by removing the printed circuit board material surrounding the pins of a mounted device leaving air to surround the pins.

The printed circuit board comprises a layer of a first insulating material having plated through holes where said layer has a first dielectric constant. The insulating material is configured such that the mounted devices have pins that extend through the plated through holes where said pins are surrounded with a second insulating material having a second dielectric constant.

BRIEF DESCRIPTION OF THE DRAWINGS

FIG. 3 shows a DDF module configured as per the present invention.

DETAILED DESCRIPTION

Figure 1:
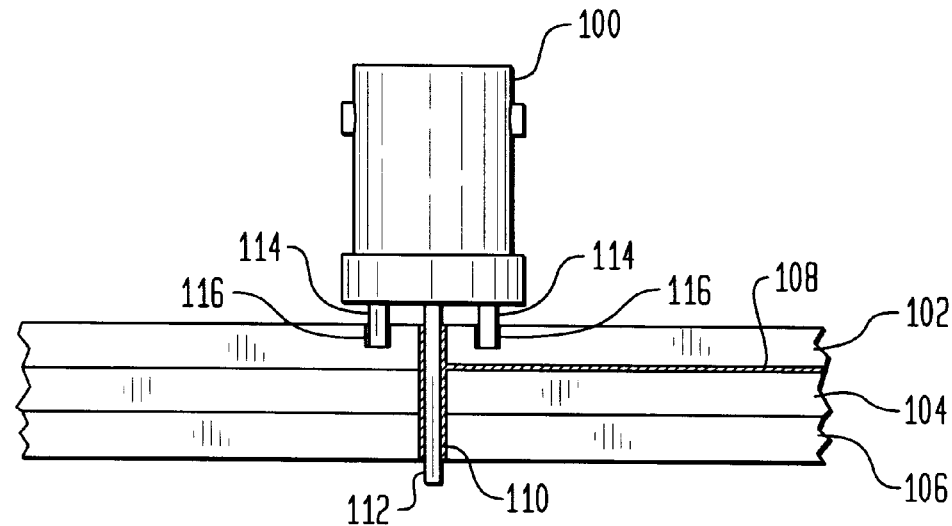
FIG. 1 depicts a prior art configuration of connector mounted to a printed circuit board.
Figure 2:
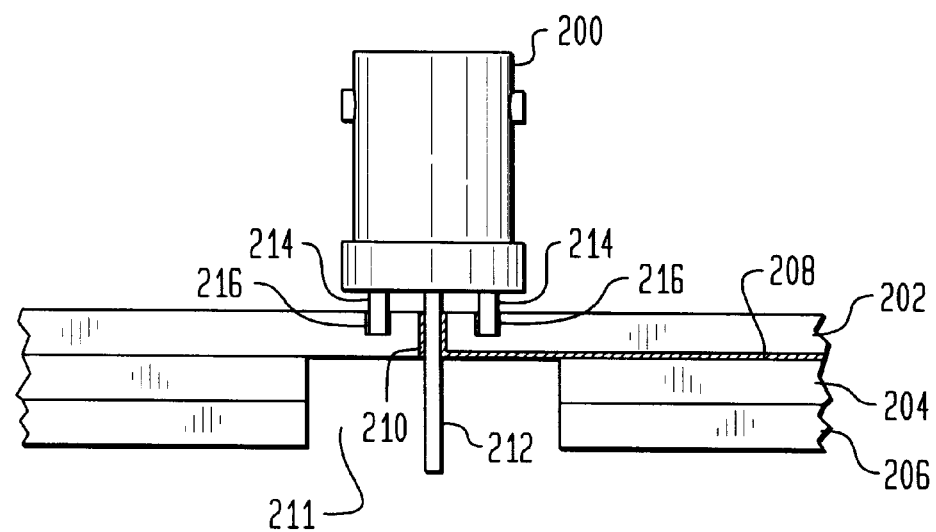
FIG. 2 depicts the configuration of the present invention.

FIG. 2 depicts the present invention showing a particular structure of a DDF module which tends to reduce the parasitic effects of center conductor 212. The printed circuit board layers (202, 204, 206) on which connector 200 is mounted are made from an insulating material having a certain dielectric constant. The parasitic effect between center conductor 212 and layers 204 and 206 is reduced by removing the insulating material in a region 211 surrounding the portion of center conductor 212 extending past conductor 208 leaving air to surround that portion of center conductor 212. The dielectric constant of the insulating material (e.g., FR-4 material) used for the printed circuit board material is approximately four times the dielectric constant of air. Thus, the technique of the present invention can reduce the parasitic effects by approximately a factor of four. It should be noted that center conductor 212 can be surrounded with insulating material (having a dielectric constant) other than air.

Connector 200 is a BNC connector that has mounting pins 214 and center conductor 212. Connector 200 is mounted to layer 202 by inserting mounting pins 214 into mounting holes 216. Mounting pins 214 frictionally engage with mounting holes 216 fixedly attaching connector 200 to printed circuit board layer 202. Center conductor 212 is inserted through plated through hole (or via) 210 which is electrically connected to conductor 208. Conductor 208 is typically etched or plated onto layer 204 as a circuit trace that can be connected to another center conductor of another connector.

FIG. 3 depicts a DDF module which has four connectors (200, 226, 230, 232) mounted on one side of printed circuit board 202 and connectors 234 and 236 mounted on the other side of printed circuit board 216. Part of printed circuit board 202 is removed leaving a region 211 of air surrounding the portion of center conductors 212 that extends through plated through holes (or vias) 210. Connectors 200, 226, 230 and 232 are compliant pin connectors that have mounting pins 214 that frictionally engage with mounting holes 216 on both sides of printed circuit board 202. It will be understood by one of ordinary skill in the art to which this invention belongs that the present invention not only applies to connectors mounted on printed circuit boards but to any electrical or electronic component that can be mounted on a printed circuit board.

What is claimed is:

1. A printed circuit board for reducing parasitic effects on a conductor of an electrical component mounted on the printed circuit board, the printed circuit board comprising:

a first layer of dielectric material having a dielectric constant; and a second layer of dielectric material having a dielectric constant whereby the first layer and the second layer are attached to each other to form a hole a portion of which is plated and through which the conductor extends such that a portion of the conductor extending from the component is immediately surrounded by the first layer and all remaining portions of the conductor extending past the plated portion of the hole are not immediately surrounded by either the first or second layer.

2. The printed circuit board or claim 1 where a third layer immediately surrounds the remaining portions of the conductor extending past the plated portion of the hole and said third layer of material has a dielectric constant that is less than the dielectric constant of the first and second layers.

3. The printed circuit board of claim 1 where the conductor is electrically connected, via the plated portion of the hole, to a conductor etched onto the second layer.

4. The printed circuit board of claim 1 where the mounted component is a BNC connector.

5. The printed circuit board of claim 1 where the remaining portions are surrounded by air which has a dielectric constant that is one fourth the dielectric constant of the first dielectric material thus reducing the parasitic effects on the conductor by a factor of four.

* * * * *